HUGH J. HALL

INVENTOR

BY Paul B. Hunter

ATTORNEY

HUGH J. HALL
INVENTOR
BY Paul B. Hunter
ATTORNEY 3,082,386

TUNING MEANS FOR FLEXIBLE WALL OF RESONANT CAVITY OF KLYSTRON AMPLIFIER

Hugh J. Hall, Los Altos, Calif., assignor to Varian Associates, Palo Alto, Calif., a corporation of California Filed Sept. 1, 1959, Ser. No. 837,394
3 Claims. (Cl. 333—83)

This invention relates in general to high frequency electron emissive devices and more particularly to a novel electrostatically focused klystron amplifier which is relatively small in size and extremely light in weight.

Heretofore, klystron amplifiers in the 8 to 12 kilo megacycle frequency band have been magnetically focused in order to produce a power output at the kilowatt level. A lightweight klystron amplifier has been needed for aerial navigation systems in which weight is a prime factor. Previous klystron amplifiers have been undesirable since the weight of the magnetic focusing means, usually an electromagnet, can easily weigh thirty times as much as the tube itself and also such electromagnets consume a large amount of electrical power which the aircraft must somehow provide.

Furthermore, there has been a great need for a simple tuning means for electron tubes which is easily constructed and operated and which limits movement of the tuning diaphragm over a predetermined range in order to eliminate the possibility of tuning beyond the desired range, thus straining the tuning diaphragm.

The object of the present invention is to provide a very small, lightweight and extremely rugged klystron amplifier which does not require the use of an external focusing magnet.

A feature of the present invention is the provision of a novel cavity resonator tuning means comprising a tuner rod attached to the outside surface of one wall of the resonator and provided with a slot transversely thereof; means for mounting the tuning rod on the outside of the cavity resonator, the mounting means being provided with a cylindrical aperture the axis of which is substantially perpendicular to the axis of the tuner rod mounted in said mounting means and the aperture communicating with the transverse slot in the tuner rod; whereby a tuner tool with an eccentric projection on the end thereof can be inserted in the aperture in said mounting means with the eccentric projection engaged in the transverse slot in the tuner rod, so that the tuner rod and thus the wall of the cavity resonator can be moved over a limited distance by rotating the tuner tool.

Figure 1:
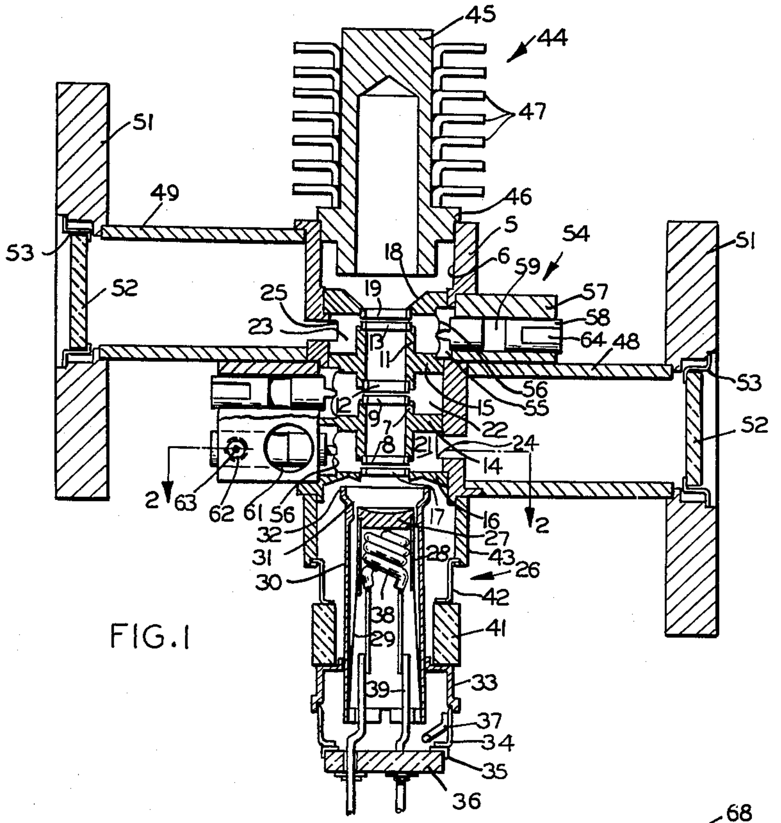
Figure 2:
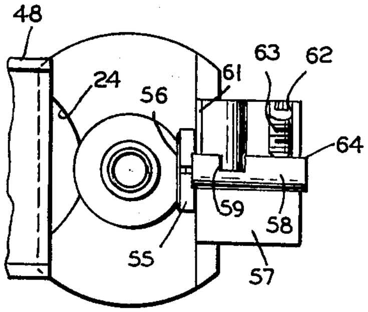
Figure 3:
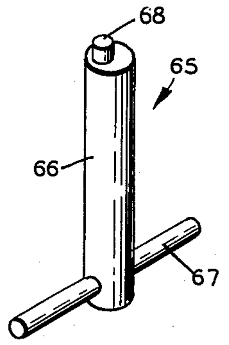
Figure 4:
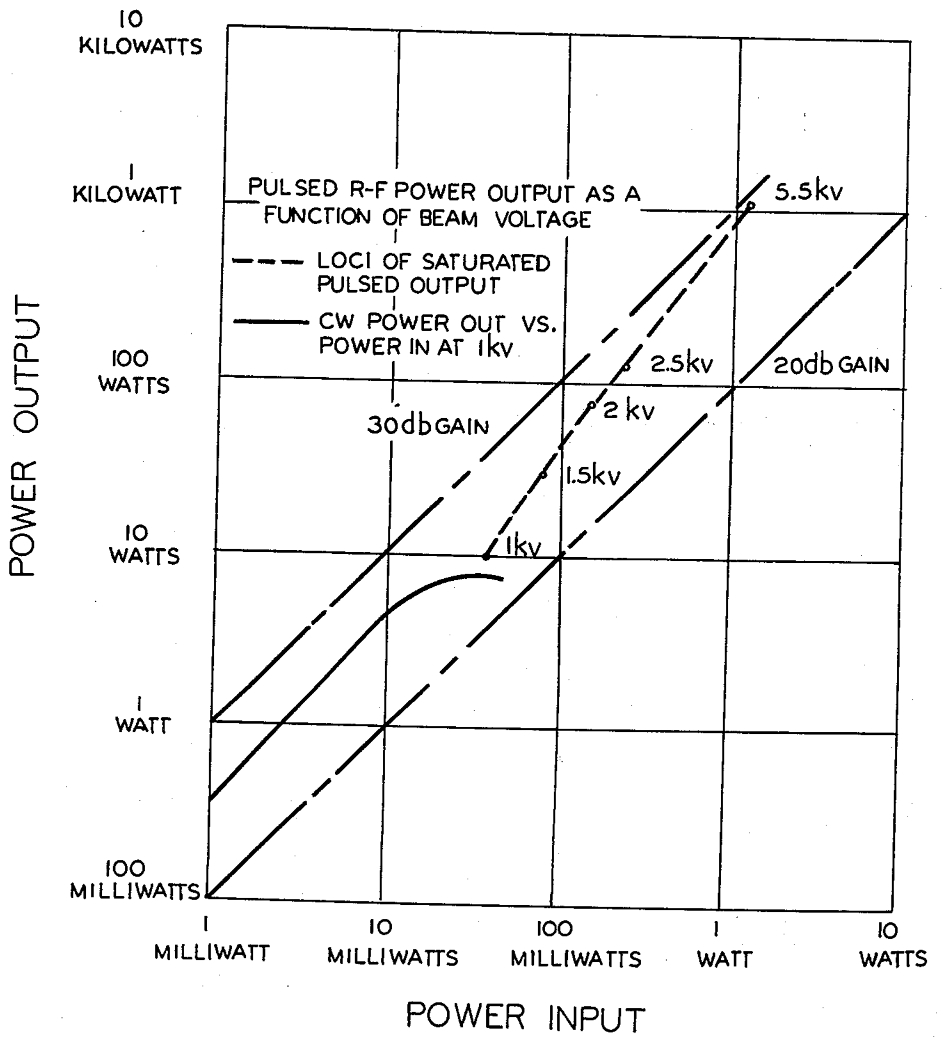

These and other features and advantages of the present invention will be more apparent upon a perusal of the following specification taken in connection with the accompanying drawings wherein, FIG. 1 is a longitudinal cross-sectional view of a novel klystron amplifier embodying the present invention with a portion of one tuner assembly thereof shown in elevation, FIG. 2 is an enlarged cross-section taken along line 2—2 in FIG. 1 showing the novel tuner assembly of the present invention, FIG. 3 is a perspective view of the tuner tool of the novel tuner assembly of the present invention, and FIG. 4 is a graph of power output plotted against power input and showing the C.W. and pulsed R.F. power as a function of beam voltage for a typical operation of the novel klystron amplifier embodying the present invention.

Referring now to FIGS. 1 and 2, the present invention includes a central body portion 5 which is made from a unitary block of metal having a multi-diameter longitudinal bore 6 extending therethrough. A hollow cylindrical drift tube 7 having circular resonator grids 8 and 9 on the ends thereof and a similar drift tube 11 having resonator grids 12 and 13 on the ends thereof are positioned within the longitudinal bore 6 by outwardly extending annular headers 14 and 15, respectively. The walls of drift tubes 7 and 11 are parallel to the axis of the electron beam passing therethrough. Affixedly secured, as by brazing, within one end of the longitudinal bore 6 of the central body portion 5 is a narrow annular anode structure 16 having a resonator grid 17 positioned in the aperture therethrough and within the other end of central body portion 5 is an annular header 18 with a resonator grid 19 positioned in the aperture therethrough. By positioning the resonator grid 17 within the anode structure 16, the resonator grid 17 serves as an anode portion and as part of the R.F. circuit beyond the anode structure 16 thereby minimizing the distance the focused electron beam must traverse through the klystron tube. Within the central body portion 5, annular anode structure 16 and header 14 on drift tube 7 define a singly re-entrant first cavity resonator 21; header 14 on drift tube 7 and header 15 on drift tube 11 define a doubly re-entrant second cavity resonator 22; and header 15 on drift tube 11 and header 18 define a singly re-entrant third cavity resonator 23. Milled openings 24 and 25 are located in the opposite side walls of the central body portion 5 providing access to the first cavity resonator 21 and the third cavity resonator 23, respectively. The use of a doubly re-entrant cavity between two singly re-entrant cavities makes it possible to place the cavity resonators as close together as possible to conserve space and to aid in maintaining beam focus.

Affixedly secured, as by brazing, to the central body portion 5 and sealing off the end thereof adjacent the anode structure 16 is a beam generating assembly 26. The beam generating assembly 26 includes a cathode button 27 positioned in one end of a hollow cylinder 28 which is fixedly secured within a hollow cylindrical focus electrode 30 by means of a conical sleeve 29. For the particular embodiment of the invention, here illustrated, the distance between the emissive surface of the cathode and its center of sphericity is 0.382″, and the distance from the anode structure 16 to the center of the sphericity of the cathode is 0.247″. The inside surface of the focus electrode 30 adjacent the cathode is of slightly greater diameter than the outside diameter of the cathode. As the inside surface of the focus electrode projects axially beyond the emissive surface of the cathode, it is beveled outwardly from its axis providing a first corner 31 and then projects axially to the end of the focus electrode which provides a second corner 32. The radius of the first corner 31 is 0.0035″ greater than the radius of the cathode button 27 and is 0.014″ away from the cathode button in an axial direction. The radius of the second corner 32 is 0.0385″ greater than the radius of the cathode button 27 and lies 0.076″ away from the cathode button in an axial direction.

The focus electrode 30 is supported within an annular flange member 33 which is in turn supported by a cup member 34. The cup member 34 is fixedly secured at its base, as by brazing, to an annular flange member 35 as of, for example, copper which, in turn, surrounds and is brazed to a ceramic sealing disk 36. A cathode and focus electrode terminal 37 is connected to the cup member 34 and is carried through a vacuum sealed opening in the ceramic disk 36. A heater 38 as of, for example, tungsten coated with alumina is carried within the hollow cylinder 28 behind the cathode button 27 by heater leads 39 which project through vacuum sealed openings in the ceramic disk 36. A hollow cylindrical ceramic insulator 41 abuts and is fixedly secured, as by brazing, to annular flange member 33 as of, for example, Kovar opposite the cup member 34, ceramic insulator 41 serving the combined function of electrical insulator and vacuum seal. A hollow cylindrical member 42 as of, for example, Kovar is secured by a flange on one end to the ceramic insulator 41 and by a flange on the other end to a hollow metallic cylinder 43 which is, in turn, fixedly secured, as by brazing, to the end of the central body portion 5 adjacent the anode structure 16.

A collector assembly 44 including a hollow cylindrical end portion 45 closed at its outward end and provided with an outwardly projecting stepped annular shoulder 46 is fixedly secured to the end of central body portion 5 adjacent the annular header 18 by a braze between the annular shoulder 46 and central body portion 5. The collector assembly 44 also includes a fin assembly comprising annular fin members 47 brazed to the cylindrical end portion 45 whereby the tube is air cooled.

Identical input and output waveguides 48 and 49, respectively, are fixedly secured to the central body portion 5 and respectively communicate with the first cavity resonator 21 and the third cavity resonator 23 through milled openings 24 and 25. The outwardly projecting end of each waveguide is provided with a waveguide flange member 51 which carries a ceramic window 52 sealed therein by a window frame 53.

Each of the three cavity resonators is tuned by an identical tuning assembly 54. A milled opening 55 is provided in central body portion 5 into each cavity resonator, and the cavity resonator is then sealed closed by a flexible tuner diaphragm 56. A tuner mounting block 57 is fixedly secured to central body portion 5, and a cylindrical tuner rod 58 is slideably mounted within a cylindrical bore in the mounting block 57, one end of the tuner rod 58 being secured to the tuner diaphragm 56 for moving the tuner diaphragm in and out. The tuner rod 58 is provided with a transverse slot 59 thereacross, and the tuner mounting block 57 is provided with a large cylindrical aperture 61 communicating with the bore which houses the tuner rod 58, the axis of the aperture 61 being substantially perpendicular to the axis of the tuner rod 58 and providing access to the transverse slot 59 in the tuner rod 58. A small cylindrical tapped aperture 62 in the tuner mounting block 57 provides access to the tuner rod 58 and contains a locking screw 63 for locking the tuner rod 58 in the desired position. Tuner rod 58 is ground flat at 64 to provide a seat for the end of locking screw 63.

Referring now to FIG. 3 a tuning tool 65 for moving the tuner rod 58 comprises a cylindrical rod 66 adapted to rotatably fit within the aperture 61 in the tuner mounting block 57. The tuning tool 65 is provided with a handle 67 at one end and cylindrical projection 68 eccentrically mounted on the other end and adapted to fit within the transverse slot 59 in tuner rod 58. When the tuning tool 65 is inserted in aperture 61 with the projection 68 engaging the transverse slot 59 in the tuner rod 58, the tuner rod can be moved over a limited distance by rotating the tuner tool thus moving tuner diaphragm 56 to change the resonance frequency of each cavity resonator. Besides being easy to construct and an efficent tuning means, this tuning assembly precludes the possibility of tuning the tuner diaphragm too far. Additionally, upon completion of the tuning operation the tuning tool 65 can be removed from said tuner mounting means and the cavity resonator operated independently therefrom.

Referring now to FIG. 4 there is shown a curve of C.W. and pulsed R.F. power output versus power input as a function of beam voltage for a typical operation of the present invention. The solid curve shows the C.W. power output versus power input at a beam potential of 1 kilovolt, while the dashed curve shows the saturation levels for various pulsed voltages. It can be seen that the kilowatt level was reached at a peak voltage of approximately 6 kilovolts under pulsed operation. The R.F. gain under these conditions was about 30 db. Thus, only about a watt of input power was required to drive the tube to saturation. The efficiency of the tube at kilowatt level under the above conditions was 16%. As is usual with klystron amplifiers, one could expect about 20% more output power by detuning the middle cavity to a silghtly higher frequency. Thus efficiency would be increased correspondingly. The penalty for this is a reduction of gain, such that probably 2 to 5 watts, drive would be required to reach the saturation level of 1.2 kilowatts instead of 1 watt as stated above.

The pulsed data obtained were taken using a pulse width of 1.5 microseconds, with a period between pulses of 600 microseconds. Thus, the duty cycle was 0.0025, so that the average power of the tube at the kilowatt level was about 2.5 watts. However, it should be pointed out that this novel klystron amplifier is not limited in its power handling ability to the values illustrated above, since a tube of this type has been operated C.W. up to 52 watts at a beam voltage of 2 kilovolts.

The typical bandwidth for this tube has been measured at about 10–20 megacycles at the 1 kilovolt level under C.W. conditions.

A primary advantage of the novel electrostatically focused klystron amplifier is its light weight. By way of example, the weight of a similar tube plus solenoid-type focusing structure would be of the order of 30 pounds while similar tubes focused by permanent magnets would generally weigh about 15 pounds. However, the weight of the electrostatically focused klystron amplifier here illustrated is only 12 ounces. If an attempt were made to minimize the design dimensions of the present tube, this weight could possibly be reduced from 12 to 8 ounces.

Furthermore the tube is extremely small in size, its overall dimensions being approximately 1½ by 2½ by 4" or 15 cubic inches. If the flange-to-flange spacing were reduced, as pointed out above, the overall size could be reduced to 1½ by 1½ by 2½" or about 6 cubic inches.

To provide electrostatic focusing at the kilowatt level, the novel klystron amplifier of the present invention has been designed with a perveance of about $5 \times 10^{-6}$ ampere/volt 3/2. At these high values of perveance the well known Pierce type electron gun design does not predict the true situation, and thus the gun design of the novel klystron tube here illustrated has been specifically designed to take into account the anode aperture lens effect and space charge spreading.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. Tuning means for cavity resonators comprising, in combination, a tuner rod attached to the outside surface of one wall of the resonator and provided with a slot transversely thereof and a tuner mounting means mounted on the outside of the resonator and adapted to slidably hold said tuner rod therein, said tuner mounting means provided with an aperture furnishing access to said tuner rod, the axis of the aperture being substantially perpendicular to the axis of said tuner rod whereby a tuner tool with an eccentric projection on the end thereof can be inserted in the aperture in said mounting means with the eccentric projection engaged in the transverse slot in the tuner rod so that the tuner rod and thus the wall of the cavity resonator can be moved over a limited distance by rotating the tuner tool and then the tuner tool removed from said aperture and the cavity resonator operated separately therefrom.

2. Tuning means for cavity resonators comprising, in combination, a tuner rod attached to the outside surface of one wall of the resonator and provided with a slot transversely thereof; a tuner mounting means mounted on the outside of the resonator and adapted to slideably hold said tuner rod therein, said tuner mounting means provided with an aperture furnishing access to said tuner rod, the axis of the aperture being substantially perpendicular to the axis of said tuner rod; and a tuner tool with an eccentric projection on the end thereof, said tool adapted to rotatably fit in the aperture in said tuner mounting means and the eccentric projection adapted to fit closely within the transverse slot in said tuner rod, whereby when said tuning tool is inserted into said tuner mounting means and said eccentric projection engaged with the slot in said tuner rod, the tuner rod and thus the wall of the cavity resonator can be moved a limited distance by rotating said tuner tool thereby to change the resonant frequency on the cavity resonator and then the tuner tool can be removed from said tuner mounting means and the cavity resonator operated independently.

3. The tuning means of claim 2 provided with a locking screw in said tuner mounting means adapted to bear against said tuner rod for locking said tuner rod against movement with respect to said tuner mounting means once the desired resonant frequency for the cavity resonator has been obtained using said tuner tool.

References Cited in the file of this patent

UNITED STATES PATENTS

| | | |
|---|---|---|
| 2,500,944 | Hansen | Mar. 21, 1950 |
| 2,736,868 | Bell | Feb. 28, 1956 |
| 2,742,617 | Bondley | Apr. 17, 1956 |
| 2,892,121 | Salisbury | June 23, 1959 |
| 2,968,013 | Auld | Jan. 10, 1961 |

FOREIGN PATENTS

| | | |
|---|---|---|
| 969,466 | Germany | June 4, 1958 |